United States Patent [19]

Jinbo

[11] Patent Number: 5,448,518
[45] Date of Patent: Sep. 5, 1995

[54] VIRTUAL GROUND TYPE NONVOLATILE SEMICONDUCTOR MEMORY DEVICE CAPABLE OF SIMULTANEOUSLY ACCESSING TWO MEMORY CELLS

[75] Inventor: Toshikatsu Jinbo, Tokyo, Japan

[73] Assignee: NEC Corporation, Tokyo, Japan

[21] Appl. No.: 290,498

[22] Filed: Aug. 15, 1994

[30] Foreign Application Priority Data

Aug. 13, 1993 [JP] Japan ............... 5-222219

[51] Int. Cl.$^6$ ............................................. G11C 13/00
[52] U.S. Cl. .................... 365/185; 365/230.01
[58] Field of Search ............ 365/189.01, 203, 185, 365/230.01

[56] References Cited

U.S. PATENT DOCUMENTS 5,218,569 6/1993 Banics ...................... 365/185

FOREIGN PATENT DOCUMENTS 3-176895 7/1991 Japan.

*Primary Examiner*—Terrell W. Fears
*Attorney, Agent, or Firm*—Young & Thompson

[57] ABSTRACT

In a virtual ground type nonvolatile semiconductor device including row lines, column lines, and floating-gate type nonvolatile memory cells, each connected between two adjacent column lines and controlled by one of the row lines, during a read mode, one of the row lines is made a high level, and two adjacent column lines are subject to a data read operation. At this time, two column lines each immediately on one side of the two adjacent column lines are made a low level. During a write mode, one of the row lines is made a high level, and two adjacent column lines are made at the low level. At this time, two column lines each immediately on one side of the two adjacent column lines are subject to a write operation.

8 Claims, 10 Drawing Sheets

N-CHANNEL ENHANCEMENT TYPE TRANSISTOR

N-CHANNEL DEPLETION TYPE TRANSISTOR

VIRTUAL GROUND TYPE NONVOLATILE SEMICONDUCTOR MEMORY DEVICE CAPABLE OF SIMULTANEOUSLY ACCESSING TWO MEMORY CELLS

BACKGROUND OF THE INVENTION

1. Field of the Invention

The present invention relates to a virtual ground type nonvolatile semiconductor memory device.

2. Description of the Related Art

A virtual ground type nonvolatile semiconductor memory including floating-gate nonvolatile memory cells has been suggested for realizing a high speed operation and low manufacturing cost (see JP-A-HEI3-176895).

A prior art virtual ground type nonvolatile semiconductor memory device includes a plurality of row lines, a plurality of column lines, and a plurality of nonvolatile memory cells each connected between two of the column lines. When reading data from a selected memory cell, the voltage at a row line connected to the selected memory cell is made high ($=V_{CC}$), and the voltage at one column line connected to the selected memory cell is made low ($=$GND). Also, the other column line connected to the selected memory cell is connected to a data read circuit, thus detecting a read current flowing through the selected memory cell. In this case, leakage currents flow through non-selected memory cells. To reduce such leakage currents, a voltage is applied to a column line connected to one of the non-selected memory cells. This will be explained later in detail.

In the above-mentioned prior art virtual ground type nonvolatile semiconductor device, however, since a voltage is applied to a non-selected column line, a current flows through this non-selected column line to charge the parasitic capacity thereof, thus increasing the power consumption. Also, a power consumption is increased by an additional circuit being provided for generating such a voltage. Further, since the nonvolatile semiconductor device is of a multi-bit parallel output type which simultaneously outputs 8 bits, 16 bits or 32 bits, the provision of additional circuits further increases the power consumption and reduces the integration.

SUMMARY OF THE INVENTION

It is an object of the present invention to reduce the power consumption in a virtual ground type nonvolatile semiconductor device.

According to the present invention, in a virtual ground type nonvolatile semiconductor device including row lines, column lines, and floating-gate type nonvolatile memory cells, each connected between two adjacent column lines and controlled by one of the row lines, during a read mode, one of the row lines is made to be at a high level ($=V_{CC}$), and two adjacent column lines are subject to a data read operation. At this time, two column lines immediately next to the two adjacent column lines are made to be at a low level($=$GND). During a write mode, one of the row lines is made a high level ($=V_{PP}$), and two adjacent column lines are made the low level. At this time, two column lines immediately next to the two adjacent column lines are subject to a write operation. Therefore, during a read mode, the difference in potential between the two adjacent column lines is very small, so little current flows through a turned-ON non-selected memory cell sandwiched by the two adjacent column lines. Also, during a write mode, the difference in potential between the two adjacent column lines is 0, so no current flows through a turned-ON non-selected memory cell sandwiched by the two adjacent column lines. Thus, leakage currents through non-selected memory cells are reduced, to thereby decrease the power consumption.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENT

Before the description of the preferred embodiment, a prior art virtual ground type nonvolatile semiconductor memory device will be explained with reference to FIGS. 1 and 2.

Figure 1:
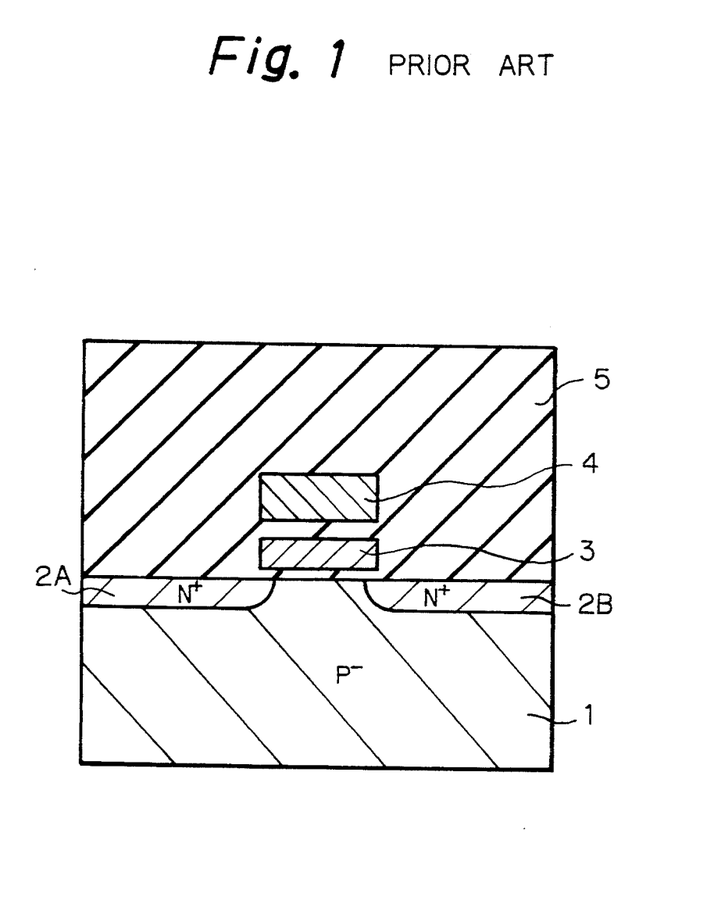
FIG. 1 is a cross-sectional view illustrating a floating-gate type nonvolatile memory cell.

In FIG. 1, which illustrates an example of a floating-gate type memory cell, this floating-gate type memory cell is comprised of a P-type semiconductor substrate 1 having an N+-type source diffusion region 2A and an N+-type drain diffusion region 2B, a floating gate 3 and a control gate 4 which are electrically isolated from the substrate 1 by an insulating layer 5. When writing data into this memory cell, a high voltage is applied to the control gate 4 and the drain diffusion region 2B and a ground potential is applied to the source diffusion region 2A. As a result, hot electrons are generated in the vicinity of the drain diffusion region 2B, and accordingly, the hot electrons having energy larger than an energy barrier of the insulating layer 5 are introduced into the floating gate 3, thus completing a write operation. Thus, the threshold voltage of the memory cell is shifted in a positive direction, to thereby enable a storage operation.

Figure 2:
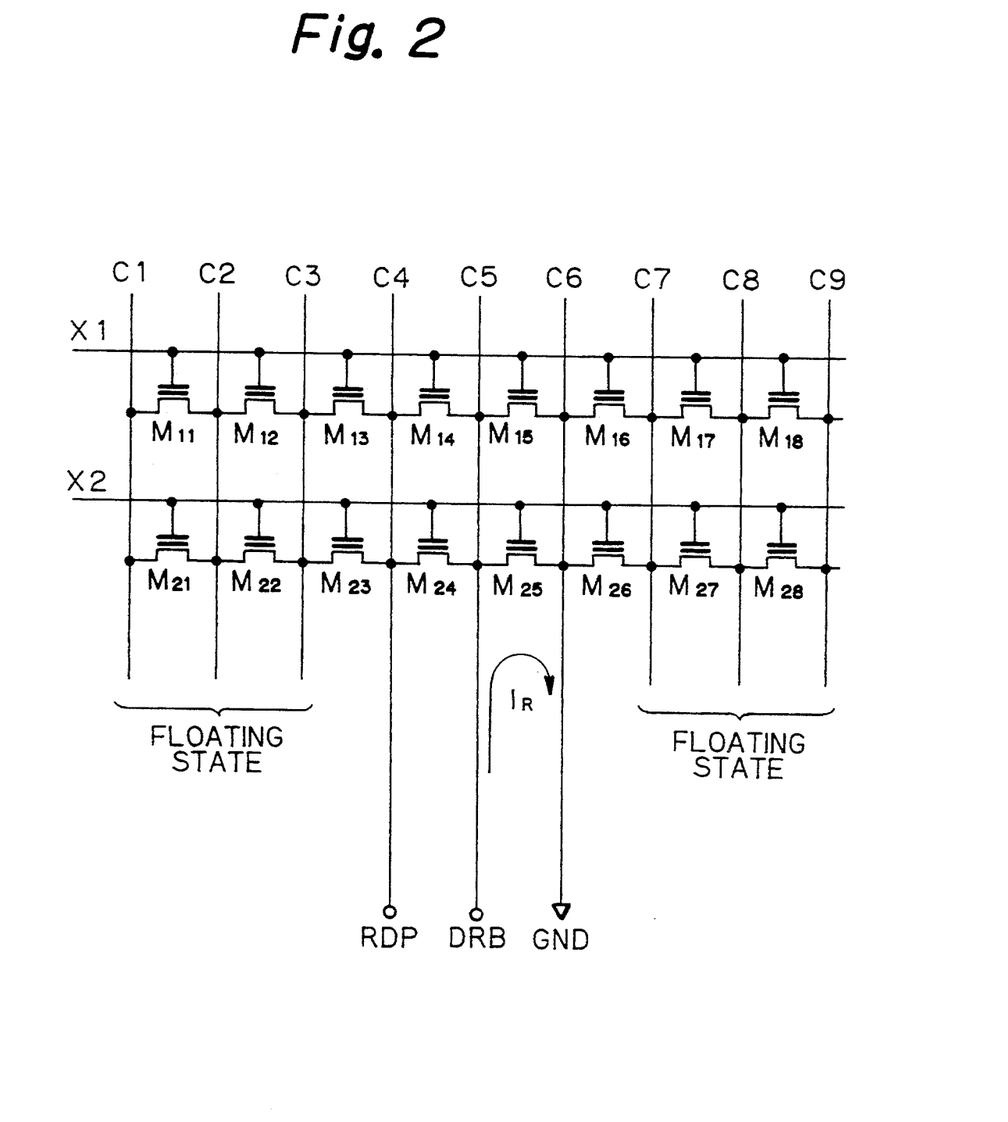
FIG. 2 is a circuit diagram illustrating a prior art virtual ground type nonvolatile semiconductor memory device.

In FIG. 2, which illustrates a prior art virtual ground type nonvolatile semiconductor memory device using the floating-gate type memory cell of FIG. 1 (see FIG.

3 of JP-A-HEI3-176895), references X1, X2, . . . designate row-lines, and C1, C2, . . . designate column lines. Memory cells $M_{11}$, $M_{12}$, . . . , $M_{21}$, $M_{22}$, . . . , which have the same configuration as the memory cell of FIG. 1, are connected to the row lines X1, X2, . . . and the column lines C1, C2, . . . . In this case, each of the memory cells $M_{11}$, $M_{12}$, . . . , $M_{21}$, $M_{22}$, . . . are connected between two adjacent column lines and is controlled by one of the row lines X1, X2, . . . . For example, the source diffusion region and the drain diffusion region of the memory cell $M_{11}$ are connected to the column lines C1 and C2, respectively, and the control gate of the memory cell $M_{11}$ is connected to the row line X1 and is controlled by the potential thereof.

A read operation upon one memory cell such as $M_{25}$ will now be explained. In this case, the voltage at the row line X2 is made a read voltage $V_{CC}$ (such as 5 V), while the voltage at the column line C6 is made GND and the column line C5 is connected to a data read circuit DRB. The data read circuit DRB detects data stored in the memory cell $M_{25}$ by detecting a current $I_R$ flowing therethrough. At this time, since the read voltage $V_{CC}$ is also applied to the control gate of the memory cell $M_{24}$ adjacent to the memory cell $M_{25}$, a leakage current may flow from the column line C5 via the non-selected memory cell $M_{24}$ to the column line C4, thus reducing the read operation speed. To avoid this reduction of the read operation speed, a voltage RDP (such as 1.2 V) equivalent to the voltage at the column line C5 is applied to the column line C4.

In the above-mentioned prior art virtual ground type nonvolatile semiconductor device of FIG. 2, however, since the voltage RDP is applied to the non-selected column line, such as C4, a current flows through this non-selected column line to charge the parasitic capacity thereof, thus increasing the power consumption. Also, a power is consumed in an additional circuit for generating the voltage RDP. Further, since the nonvolatile semiconductor device is of a multi-bit output type which simultaneously outputs 8 bits, 16 bits or 32 bits, the provision of such additional circuits complicates the device, thus increasing the power consumption and reducing the integration.

Figure 3:
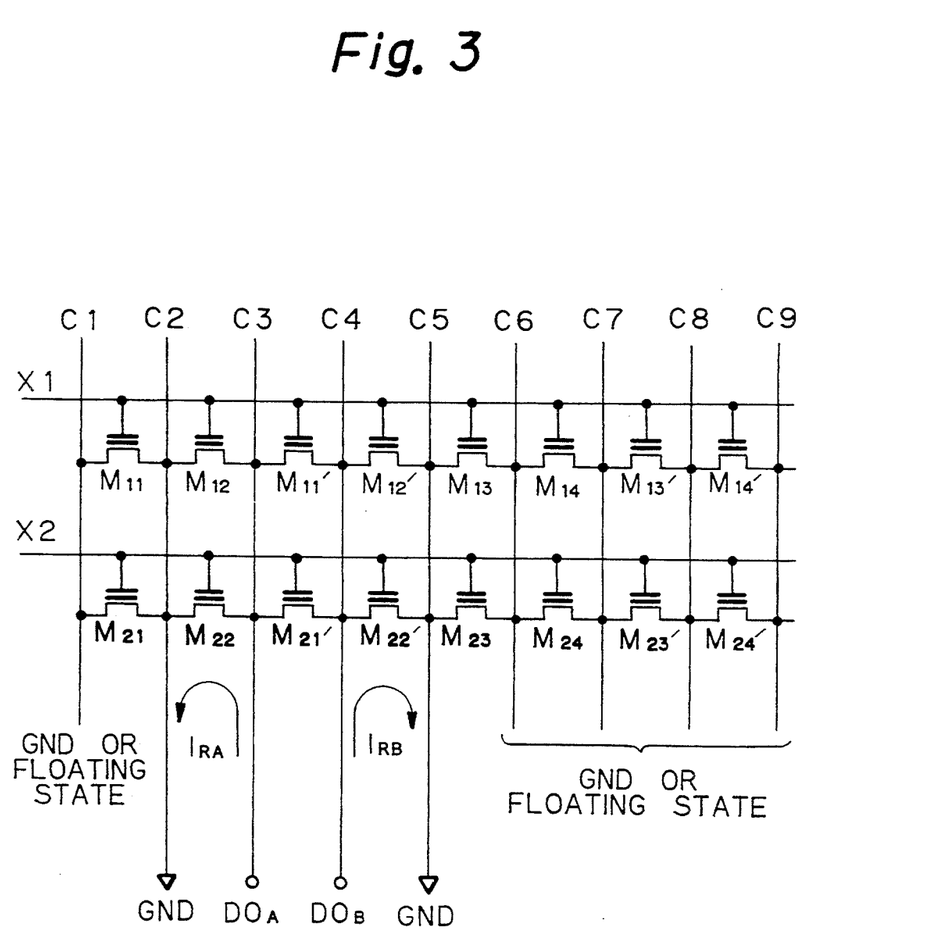
FIG. 3 is a circuit diagram illustrating a virtual ground type nonvolatile semiconductor memory device for showing a principle of a read operation according to the present invention.

In FIG. 3, which illustrates a circuit diagram for explaining a principle of a read operation according to the present invention, two memory cells such as the memory cells $M_{11}$ and $M_{11}'$ and the memory cells $M_{12}$ and $M_{12}'$ are simultaneously read.

For example, assume that the memory cells $M_{22}$ and $M_{22}'$ are simultaneously read. In this case, the voltage at the row line X2 is made the data read voltage $V_{CC}$, and the voltages at the column lines C2 and C5 are made the ground potential GND. Note that the voltages at the other column lines C1, C6, C7, C8 and C9 are made the ground potential GND or are in a floating state. As a result, in the memory cell $M_{22}$, since the column line C2 is grounded, a read current $I_{RA}$ in accordance with the data of the memory cell $M_{22}$ flows as indicated by an arrow, so that the read current $I_{RA}$ is recognized as read data $DO_A$ by a data read circuit (not shown). On the other hand, in the memory cell $M_{22}'$, since the column line C5 is grounded, a read current $I_{RB}$ in accordance with the data of the memory cell $M_{22}'$ flows as indicated by an arrow, so that the read current $I_{RB}$ is recognized as read data $DO_B$ by a data read circuit (not shown).

Even in the non-selected memory cell $M_{21}'$ sandwiched by the selected memory cells $M_{22}$ and $M_{22}'$, although the control gate, i.e., the row line X2 is at $V_{CC}$, since the difference in potential between the column lines C3 and C4 is very small, little current flows through the memory cell $M_{21}'$. As a result, little leakage current flows from the column lines C3 and C4 to the memory cell $M_{21}'$. Thus, the reduction of a read operation speed is avoided.

Figure 4:
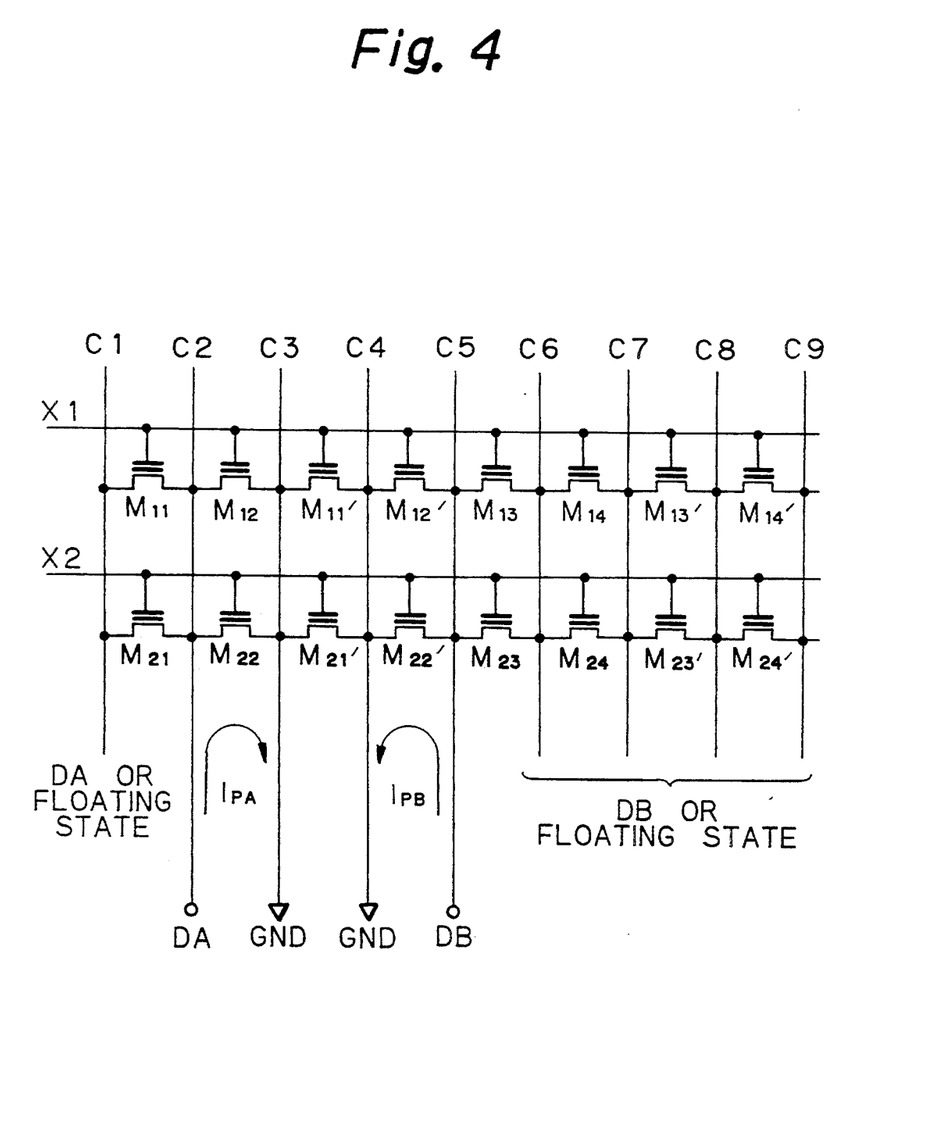
FIG. 4 is a circuit diagram illustrating a virtual ground type nonvolatile semiconductor memory device for showing a principle of a write operation according to the present invention.

In FIG. 4, which illustrates a circuit diagram for explaining a principle of a write operation according to the present invention, two memory cells such as the memory cells $M_{11}$ and $M_{11}'$ and the memory cells $M_{12}$ and $M_{12}'$ are simultaneously written to.

For example, assume that the memory cells $M_{22}$ and $M_{22}'$ are simultaneously written in. In this case, the voltage at the row line X2 is made a data write voltage $V_{PP}$ (such as 12 V), and the voltages at the column lines C3 and C4 are made the ground potential GND. A write current $I_{PA}$ corresponding to a write data DA is supplied from a write control circuit (not shown) to the column lines C1 and C2 located on the left side of the selected memory cell $M_{22}$. On the other hand, A write current $I_{PB}$ corresponding to a write data DB is supplied from a write control circuit (not shown) to the column lines C5, C6, C7, C8 and C9 located on the right side of the selected memory cell $M_{22}'$. Note that the voltages at the column lines C1, C6, C7, C8 and C9 can be made in a floating state.

Even in the non-selected memory cell $M_{21}'$ sandwiched by the selected memory cells $M_{22}$ and $M_{22}'$, although the control gate, i.e., the row line X2 is at $V_{PP}$, since the difference in potential between the column lines C3 and C4 is 0, no current flows through the memory cell $M_{21}'$. As a result, no leakage current flows from the column lines C3 and C4 to the memory cell $M_{21}'$. Thus, no write operation is performed upon the non-selected memory cell $M_{21}'$.

Figure 5:
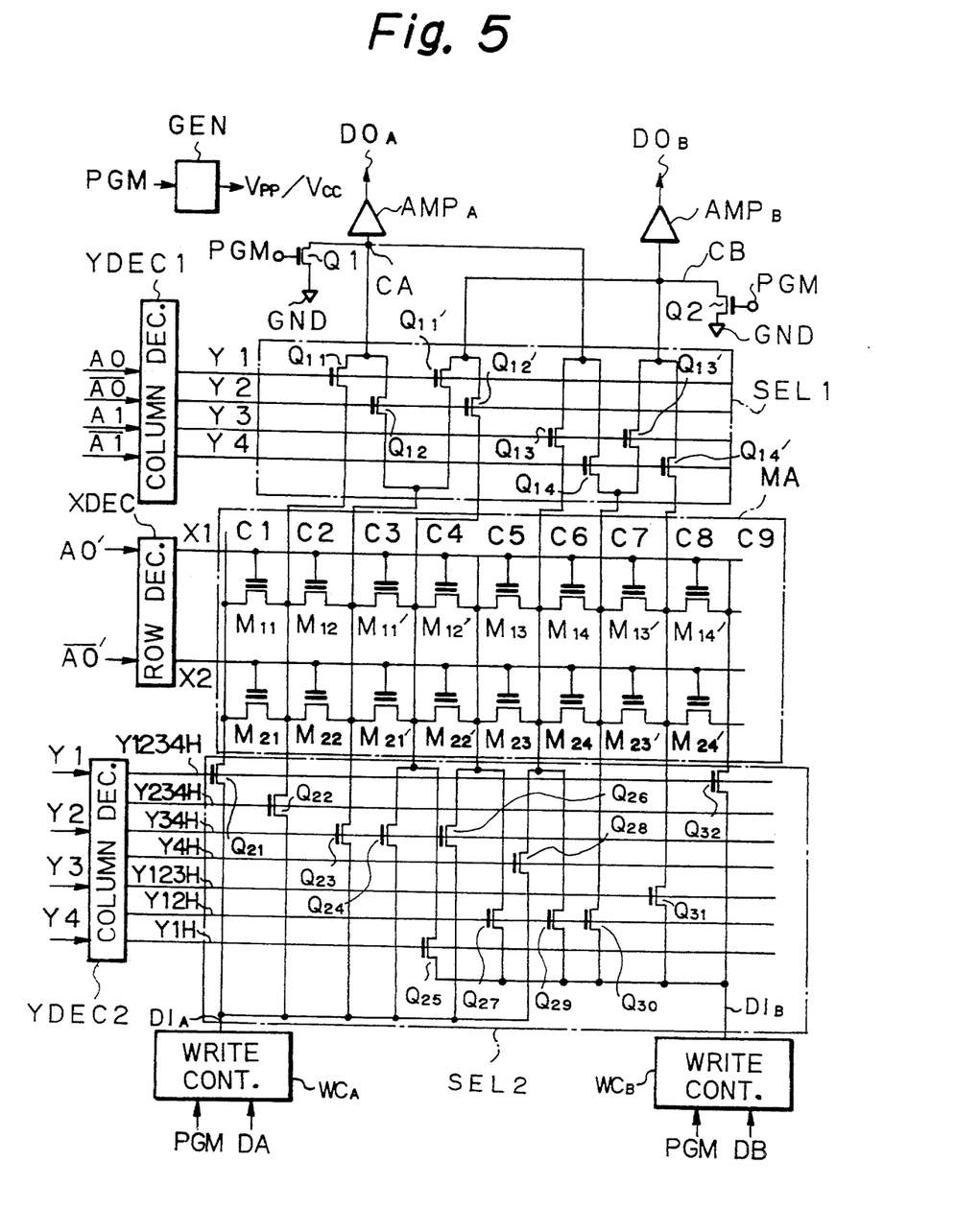
FIG. 5 is a circuit diagram illustrating an embodiment of the virtual ground type nonvolatile semiconductor memory device according to the present invention.

In FIG. 5, which illustrates an embodiment of the virtual ground type nonvolatile semiconductor memory device according to the present invention, for realizing the read operation principle of FIG. 3 and the write operation principle of FIG. 4, reference MA designates a memory cell array including the memory cells $M_{11}$, $M_{12}$, $M_{11}'$, $M_{12}'$, . . . .

Reference GEN designates a $V_{PP}/V_{CC}$ voltage generating circuit that generates a voltage $V_{PP}/V_{CC}$. During a read mode (PGM="0"), the voltage $V_{PP}/V_{CC}$ is $V_{CC}$, while, during a write mode (PGM="1"), the voltage $V_{PP}/V_{CC}$ is $V_{PP}$. The details of the $V_{PP}/V_{CC}$ voltage generating circuit will be explained later.

Selection of the row lines X1 and X2 is carried out by a row decoder XDEC. That is, the row decoder XDEC receives a row address signal A0' and its inverted signal $\overline{A0'}$, to thereby select one of the row lines X1 and X2 and make the voltage thereof at a high level. In this case, during a read mode, the high level is $V_{CC}$, while during a write mode, the high level is $V_{PP}$. Note that, if the number of row lines is 4 $(=2^2)$, 8 $(=2^3)$, . . . , the number of bits of the row address signals is 2, 3, . . . . The details of the row decoder XDEC will be explained later.

Selection of the column lines C1, C2, . . . is carried out by a selector SEL1 formed by transistors $Q_{11}$, $Q_{12}$, $Q_{11}'$, $Q_{12}'$, . . . , a column decoder YDEC1, a selector SEL2 formed by transistors $Q_{21}$, $Q_{22}$, $Q_{23}$, $Q_{24}$, . . . , and a column decoder YDEC2.

The column decoder YDEC1 receives column address signals A0 and A1 and their inverted signals $\overline{A0}$ and $\overline{A1}$, to thereby select one of outputs Y1, Y2, Y3 and Y4 and make the voltage thereof $V_{CC}$. For example, when the output Y2 is $V_{CC}$, the transistors $Q_{12}$ and $Q_{12}'$ of the selector SEL1 are turned ON, and accordingly, the two adjacent column lines C3 and C4 are selected, i.e., the two memory cells $M_{12}$ and $M_{12}'$ sandwiching the memory cell $M_{11}'$ and the two memory cells $M_{22}$ and $M_{22}'$ sandwiching the memory cell $M_{21}'$ are selected.

The two memory cells, such as $M_{22}$ and $M_{22}'$ selected by the row decoder XDEC, the column decoder YDEC1 and the selector SEL1 are connected to nodes CA and CB, respectively, which are connected to data read circuits $AMP_A$ and $AMP_B$ and transistors Q1 and Q2 for activating/deactivating the data read circuits $AMP_A$ and $AMP_B$. Therefore, during a read mode (PGM="0"), the transistors Q1 and Q2 are turned OFF and accordingly, the column lines C3 and C4 are effectively connected to the data read circuits $AMP_A$ and $AMP_B$, respectively. As a result, the two selected memory cells, such as $M_{22}$ and $M_{22}'$ are effectively connected to the data read circuits $AMP_A$ and $AMP_B$, respectively. On the other hand, during a write mode (PGM="1"), the transistors Q1 and Q2 are turned ON, and accordingly, the data read circuits $AMP_A$ and $AMP_B$, are deactivated while the column lines C3 and C4 are grounded.

Note that, if the number of column lines is increased, the number of bits of the column address signals is increased. However, since the number of transistors in the selector SEL1 is four, such as $Q_{11}$, $Q_{12}$, $Q_{11}'$ and $Q_{12}'$, per unit, accordingly the number of transistors in the selector SEL1 is 4, 8, 16, .... Similarly, the number of outputs in the column decoder YDEC1 is two, such as Y1 and Y2, per unit, and accordingly, the number of outputs in the column decoder YDEC1 is 2, 4, 8, .... The details of the column decoder YDEC1 will be explained later.

The column decoder YDEC2 receives the outputs Y1, Y2, Y3 and Y4 of the column decoder YDEC1 to thereby generate outputs Y1234H, Y234H, Y34H, Y4H, Y123H, Y12H and Y1H. For example, when the output Y2 received by the column decoder YDEC1 is high (=$V_{CC}$), the outputs Y1234H, Y234H, Y123H and Y12H, each including having the numeral 2, are made high (=$V_{PP}/V_{CC}$), and as a result, the transistors $Q_{21}$, $Q_{22}$, $Q_{27}$, $Q_{29}$, $Q_{30}$, $Q_{31}$ and $Q_{32}$ of the selector SEL2 are turned ON. As a result, if the selected memory cells are $M_{22}$ and $M_{22}'$, the column lines C1 and C2 on the left side of the memory cell $M_{22}$ are connected to a write control circuit $WC_A$, and the column lines C5, C6, C7, C8 and C9 on the right side of the memory cell $M_{22}'$ are connected to a write control circuit $WC_B$.

On the other hand, the write control circuit $WC_A$ ($WC_B$) outputs a voltage $DI_A$ ($DI_B$) in accordance with the voltage at a program terminal PGM and data DA (DB). For example, during a read mode (PGM="0"), the voltage $DI_A$ ($DI_B$) is the ground level GND regardless of the data DA (DB). Also, during a write mode (PGM="1"), when the data DA (DB) is "0", the voltage $DI_A$ ($DI_B$) is the ground level GND, while when the data DA (DB) is "1", the voltage $DI_A$ ($DI_B$) is the high voltage $V_{PP}$.

Therefore, during a read mode, the column lines C1 and C2 on the left side of the selected memory cell $M_{22}$ and the column lines C5, C6, C7, C8 and C9 on the right side of the selected memory cell $M_{22}'$ are grounded by the column decoder YDEC2 and the selector SEL2. During a write mode, the column lines C1 and C2 on the left side of the selected memory cell $M_{22}$ are made the voltage $DI_A$ by the column decoder YDEC2, the selector SEL2 and the write control circuit $WC_A$, and the column lines C5, C6, C7, C8 and C9 on the right side of the selected memory cell $M_{22}'$ are made the voltage $DI_B$ by the column decoder YDEC2, the selector SEL2 and the write control circuit $WC_B$.

Note that, although it is possible to make the non-selected column lines C1, C6, C7, C8 and C9 in a floating state as illustrated in FIGS. 3 and 4, the column decoder YDEC2 and the selector SEL2 become more complex.

The details of the column decoder YDEC2 and the selector SEL2 will be explained later.

Thus, in FIG. 5, during a read mode, since the column lines C3 and C4 within the selected memory cells $M_{22}$ and $M_{22}'$ are effectively connected to the data read circuits $AMP_A$ and $AMP_B$, and the column lines C1, C2, C5, C6, C7, C8 and C9 outside of the selected memory cells $M_{22}$ and $M_{22}'$ are grounded, the difference in potential between the column lines C3 and C4 is small. Therefore, even when the non-selected memory cell $M_{21}'$ is turned ON, little current flows from the column line C3 via the non-selected memory cell $M_{21}'$ to the column line C4 or vice versa.

Also, during a write mode, since the column lines C3 and C4 within the selected memory cells $M_{22}$ and $M_{22}'$ are grounded by the transistors Q1 and Q2, and the column lines C1, C2, C5, C6, C7, C8 and C9 outside of the selected memory cells $M_{22}$ and $M_{22}'$ are made the voltage $DI_A$ or $DI_B$ by the write control circuits $WC_A$ and $WC_B$ in accordance with the data DA or DB, the difference in potential between the column lines C3 and C4 is 0. Therefore, even when the non-selected memory cell $M_{21}'$ is turned ON, no current flows from the column line C3 via the non-selected memory cell $M_{21}'$ to the column line C4 or vice versa.

Each portion of the device of FIG. 5 will be explained below.

Figure 6:
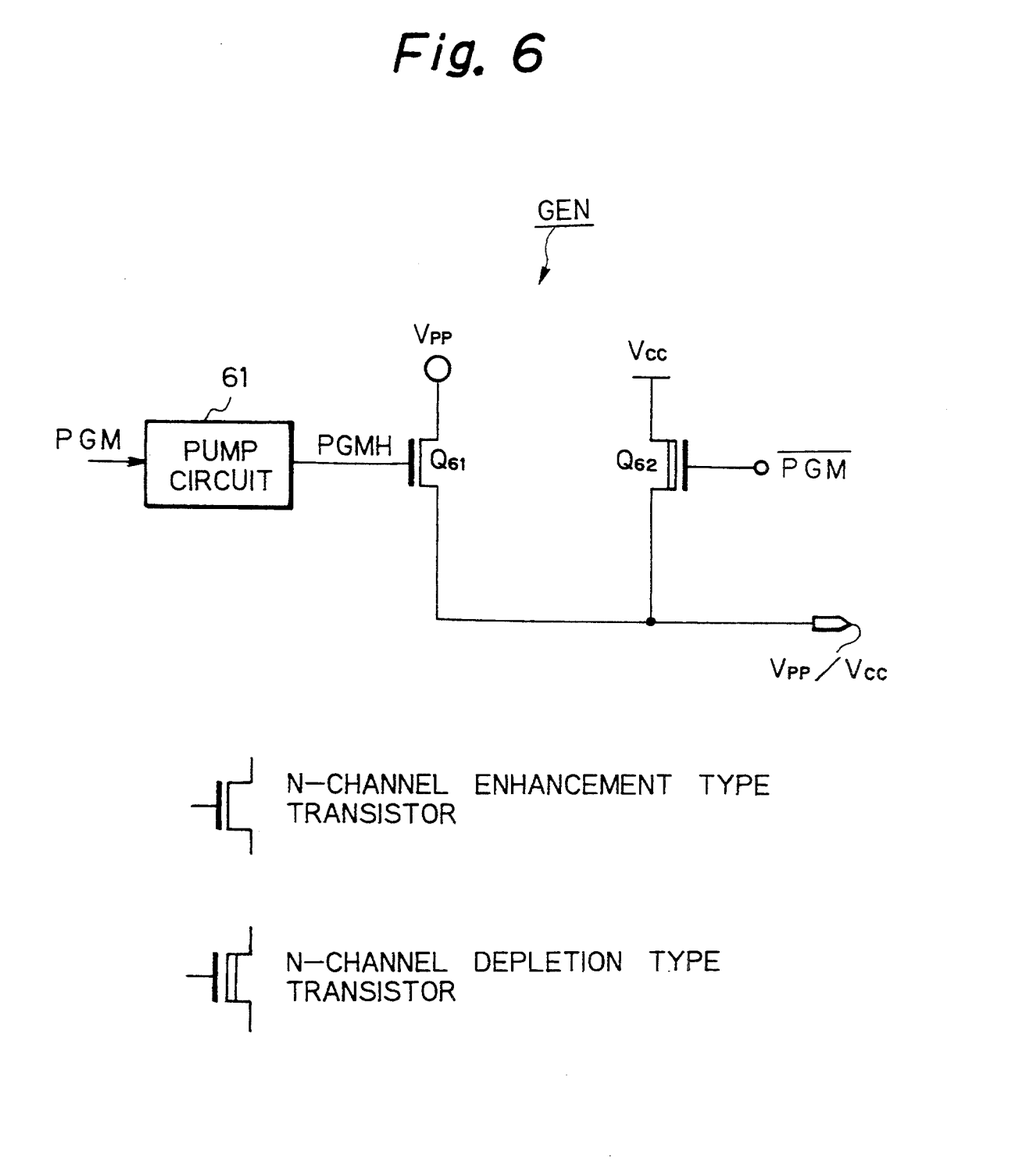
FIG. 6 is a detailed circuit diagram of the $V_{PP}/V_{CC}$ voltage generating circuit of FIG. 5.

In FIG. 6, which is a detailed circuit diagram of the $V_{PP}/V_{CC}$ voltage generating circuit GEN of FIG. 5, the two power supply voltages $V_{PP}$ and $V_{CC}$ are provided. As sated above, the voltages $V_{PP}$ and $V_{CC}$ are 12 V and 5 V, respectively. In this case, the voltage $V_{PP}$ is generated by a step-up circuit (not shown). Also, reference $Q_{61}$ designates an N-channel enhancement type transistor receiving the voltage $V_{PP}$, while $Q_{62}$ designates an N-channel depletion type transistor receiving the voltage $V_{CC}$. The transistor $Q_{61}$ is controlled by an output PGMH of a pump circuit 61 which is also controlled by the program signal PGM, while the transistor $Q_{62}$ is controlled by an inverted signal $\overline{PGM}$ of the program signal PGM.

In FIG. 6, during a read mode (PGM="0"), the output PGMH of the pump circuit 61 is low (=0 V), and therefore, the transistor $Q_{61}$ is turned OFF Simultaneously, since the signal $\overline{PGM}$ is at $V_{CC}$, the voltage $V_{PP}/V_{CC}$ is pulled by the transistor $Q_{62}$ to $V_{CC}$.

On the other hand, during a write mode (PGM="1"), the output PGMH of the pump circuit 61 is at a high level, such as 17 V, higher than $V_{PP}+V_{th}$, where $V_{th}$ is a threshold voltage of the transistor $Q_{61}$, and therefore, the voltage $V_{PP}/V_{CC}$ is pulled up by the transistor $Q_{61}$ to $V_{PP}$. In this case, the transistor $Q_{62}$ is in an OFF state or in a low conductance state.

Thus, the $V_{PP}/V_{CC}$ voltage generating circuit GEN can generate the voltage $V_{PP}/V_{CC}$ which is $V_{PP}$ or $V_{CC}$ in accordance with the voltage of the program signal PGM.

Figure 7:
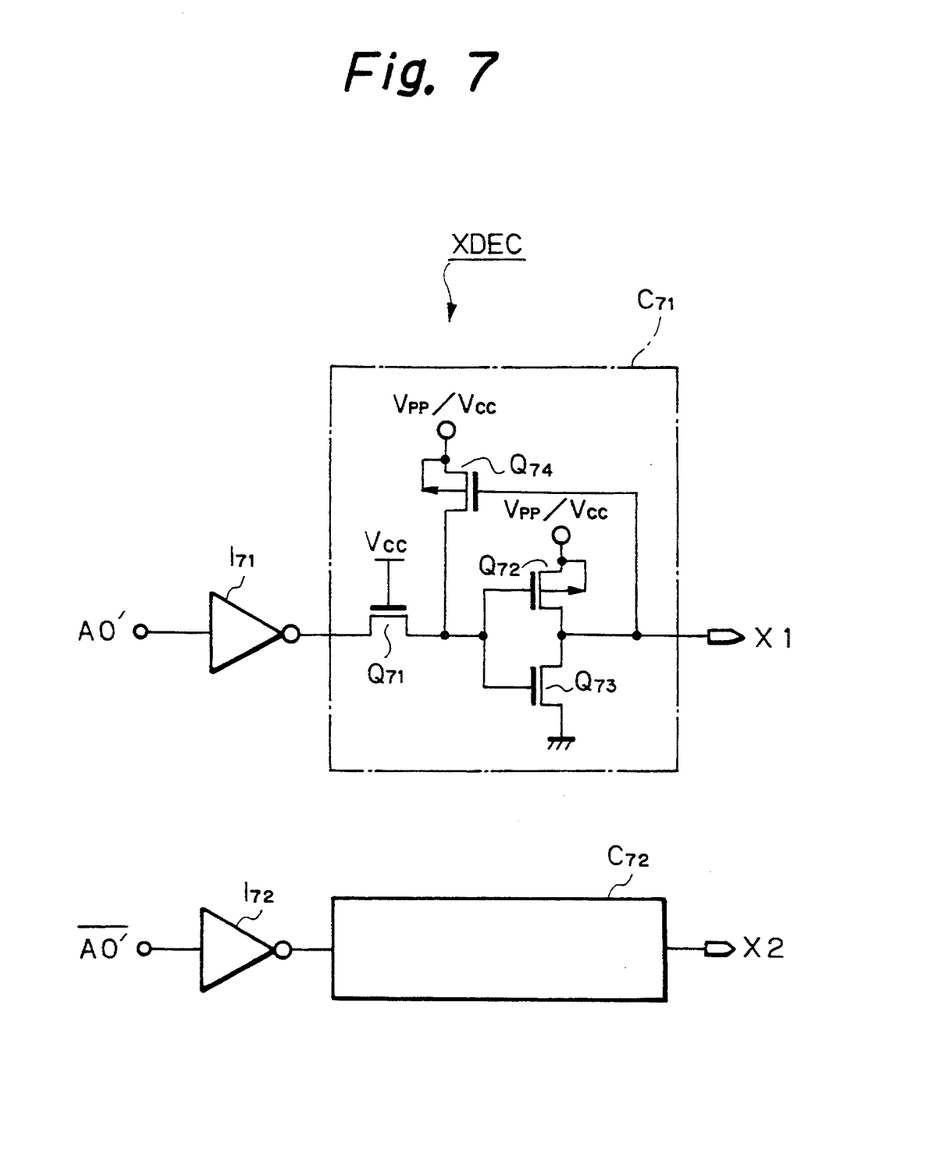
FIG. 7 is a detailed circuit diagram of the row decoder XDEC of FIG. 5.

In FIG. 7, which is a detailed circuit diagram of the row decoder XDEC of FIG. 5, the same configuration is adopted for the row lines X1 and X2. That is, an inverter $I_{71}$ for receiving the row address signal A0' and a circuit $C_{71}$ are provided for the row line X1 and an inverter $I_{72}$ for receiving the row address signal $\overline{A0'}$ and a circuit $C_{72}$ are provided for the row line X2. The circuit $C_{71}$ ($C_{72}$) consists of an N-channel transistor $Q_{71}$ for preventing the high voltage $V_{PP}$ from being applied to the inverter $I_{71}$, an inverter formed by a P-channel transistor $Q_{72}$ and an N-channel transistor $Q_{73}$ and a P-channel transistor $Q_{74}$ for the feedback control of the inverter ($Q_{72}$, $Q_{73}$). For example, when the row address signals A0' and $\overline{A0'}$ are high ($=V_{CC}$) and low ($=$GND), respectively, the outputs of the inverters $I_{71}$ and $I_{72}$ are low and high, respectively. As a result, the voltage at the row line X1 is made $V_{PP}/V_{CC}$ by the inverter ($Q_{72}$, $Q_{73}$) of the circuit $C_{71}$, while the voltage at the row line X2 is made GND by the inverter ($Q_{72}$, $Q_{73}$) of the circuit $C_{72}$. That is, the row line X1 is selected. In this case, during a read mode, the row line X1 is at $V_{CC}$, while during a write mode, the row line X1 is at $V_{PP}$.

Note that, if the number of row lines is increased, a NAND circuit or a NOR circuit is used instead of the inverter $I_{71}$ ($I_{72}$).

Figure 8:
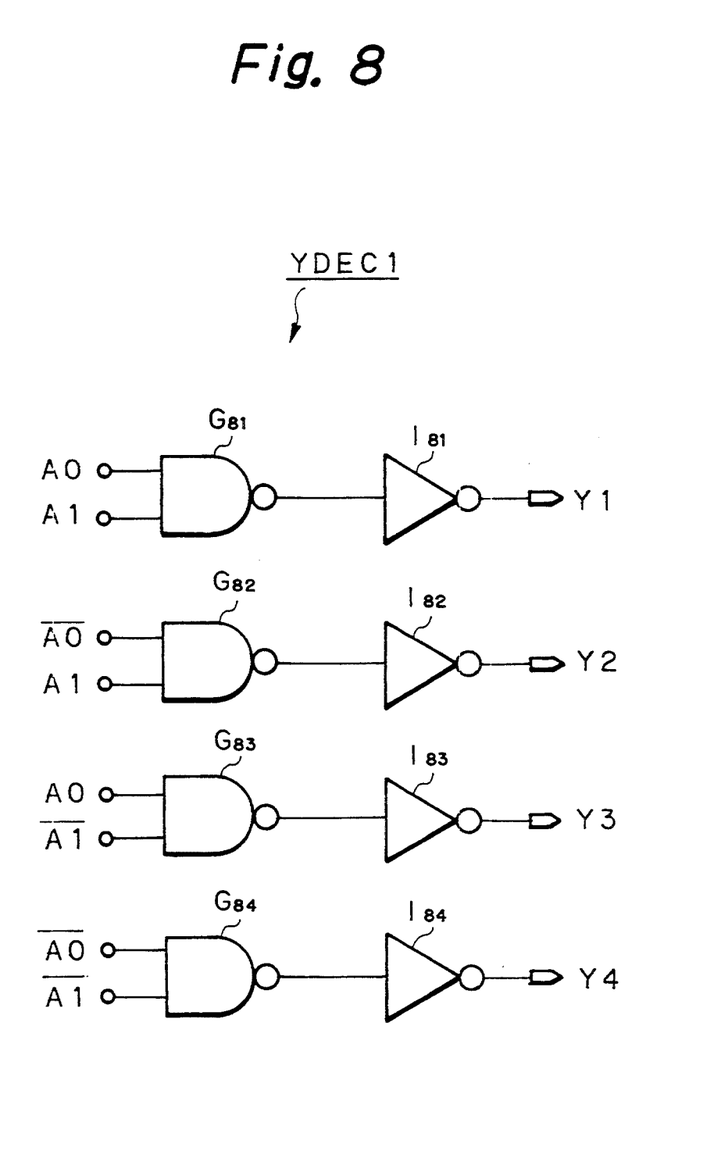
FIG. 8 is a detailed circuit diagram of the column decoder YDEC1 of FIG. 5.

In FIG. 8, which is a detailed circuit diagram of the column decoder YDEC1 of FIG. 5, four NAND circuits $G_{81}$, $G_{82}$, $G_{83}$ and $G_{84}$ and four inverters $I_{81}$, $I_{82}$, $I_{83}$ and $I_{84}$ are provided. Any two of the column address signals A0, A1, $\overline{A0}$, and $\overline{A1}$ are supplied to each of the NAND circuits $G_{81}$, $G_{82}$, $G_{83}$ and $G_{84}$. Therefore, only one of the outputs Y1, Y2, Y3 and Y4 is high ($=V_{CC}$), and the other outputs are low ($=$GND). For example, if A0=A1="1", the output Y1 is high, and the outputs Y2, Y3 and Y4 are low.

Figure 9:
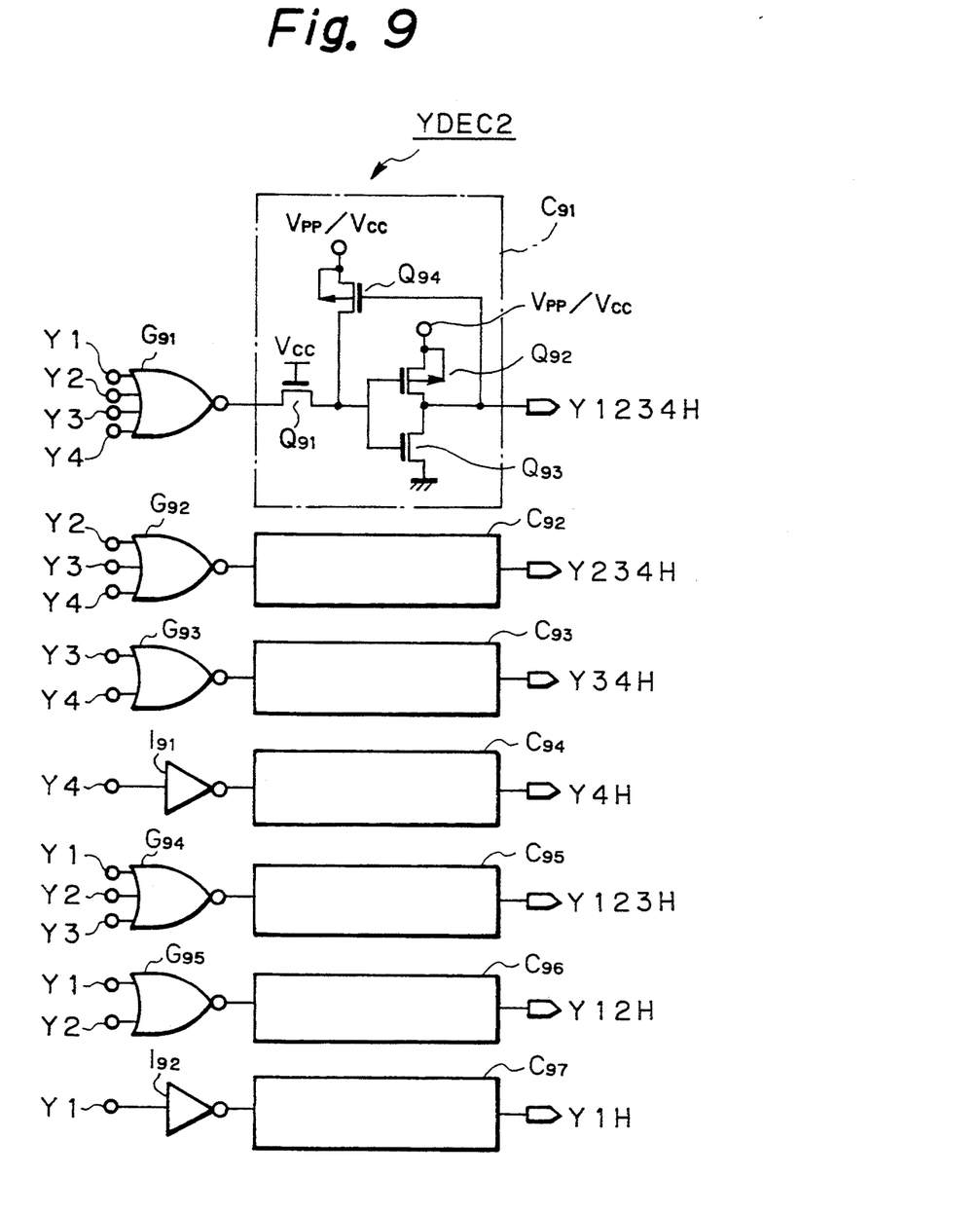
FIG. 9 is a detailed circuit diagram of the column decoder YDEC2 of FIG. 5.

In FIG. 9, which is a detailed circuit diagram of the column decoder YDEC2 of FIG. 5, NOR circuits $G_{91}$ to $G_{95}$, inverters $I_{91}$ and $I_{92}$, and circuits $C_{91}$ to $C_{97}$ which have the same configuration as the circuits $C_{71}$ and $C_{72}$ of FIG. 7, are provided.

For example, in order to make the output Y1234H high, the signals Y1, Y2, Y3 and Y4 corresponding to the numerals "1", "2", "3" and "4", respectively, labeled in the output Y1234H are supplied to the NOR circuit $C_{91}$. In this case, when at least one of the signals Y1, Y2, Y3 and Y4 is made high, the output of the NOR circuit $C_{91}$ becomes low, so that the output Y1234H becomes the high voltage $V_{PP}/V_{CC}$. In the entire circuit of FIG. 9, when the signal Y1 is made high, the outputs of the NOR circuits $G_{91}$, $G_{94}$ and $G_{95}$ and the inverter $I_{92}$ become low, so that the outputs Y1234H, Y123H, Y12H and Y1H of the circuits $C_{91}$, $C_{95}$, $C_{96}$ and $C_{97}$ become the high voltage $V_{PP}/V_{CC}$.

Figure 10A:
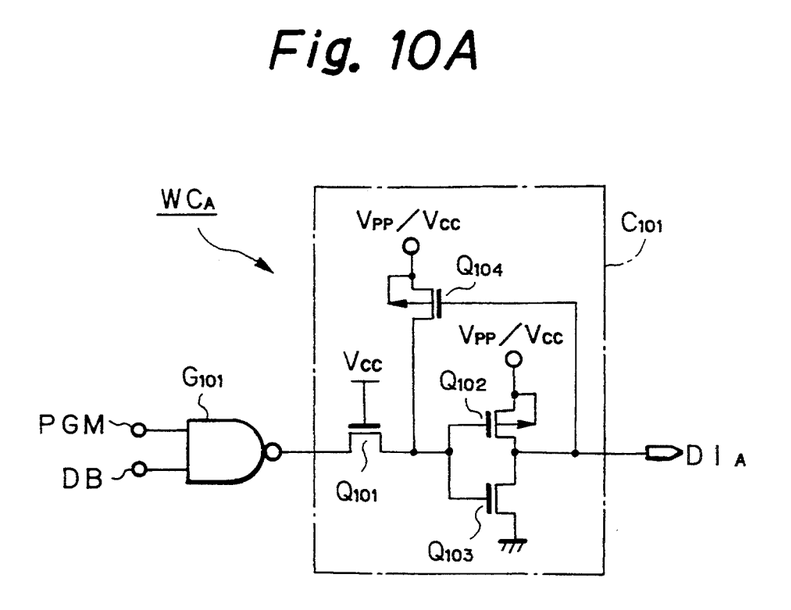
FIGS. 10A and 10B are detailed circuit diagrams of the write control circuit of FIG. 5.
Figure 10B:
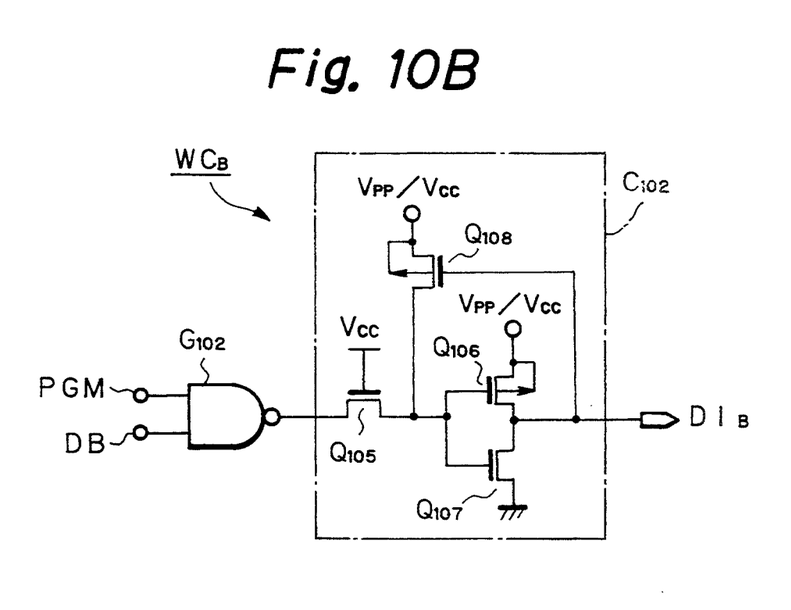

In FIGS. 10A and 10B, which are detailed circuit diagrams of the write control circuits $WC_A$ and $WC_B$, respectively, of FIG. 5, the write control circuit $WC_A$ is comprised of a NAND circuit $G_{101}$ for receiving the program signal PGM and the write data DA and a circuit $C_{101}$ which have the same configuration as the circuits $C_{71}$ and $C_{72}$ of FIG. 7, and the write control circuits $WC_B$ is comprised of a NAND circuit $G_{102}$ for receiving the program signal PGM and the write data DB and a circuit $C_{102}$ which have the same configuration as the circuits $C_{71}$ and $C_{72}$ of FIG. 7.

For example, during a read mode (PGM=low (GND)), the outputs of the NAND circuits $G_{101}$ and $G_{102}$ become high ($=V_{CC}$) regardless of the data DA and DB, so that the outputs $DI_A$ and $DI_B$ of the circuits $C_{101}$ and $C_{102}$ become low ($=$GND). On the other hand, during a write mode (PGM=high ($V_{CC}$)), the outputs of the NAND circuits $G_{101}$ and $G_{102}$ become high and low in accordance with the data DA and DB, so that the outputs $DI_A$ and $DI_B$ of the circuits $C_{101}$ and $C_{102}$ become high ($=V_{PP}/V_{CC}$) and low ($=$GND) in accordance with the data DA and DB.

In the above-described embodiment, the high level $V_{PP}/V_{CC}$ of the outputs $DI_A$ and $DI_B$ of the write control circuits $WC_A$ and $WC_B$ is the same as the high level $V_{PP}/V_{CC}$ of the outputs of the column decoder YDEC2; however, the high level of the outputs of the column decoder YDEC2 can be increased by a threshold voltage of the transistors $Q_{21}$ to $Q_{32}$ as compared with the high level of the outputs of the write control circuit $WC_A$ and $WC_B$, to thereby effectively turn ON the transistors $Q_{21}$ to $Q_{31}$.

In the prior art virtual ground nonvolatile semiconductor memory device as illustrated in FIG. 2, a bias circuit for biasing a non-selected column line such as C4 in FIG. 2 is needed which results in surplus power consumption. For example, if the parasitic capacity of one column line is 10 pF, the bias voltage is 1.2 V, and the operation cycle is 50 ns, then this surplus power consumption is 10 pF × 1.2 V/50 ns = 0.24 mA. Also, if the device is of a 16-bit parallel output type, the surplus power consumption is 0.24 mA × 16 = 3.84 mA. However, in the present invention, such a surplus power consumption is not required since the above-mentioned bias circuit is not provided.

As explained hereinbefore, according to the present invention, since an access operation is simultaneously performed upon two memory cells sandwiching one non-selected memory cell, a leakage current flowing through the non-selected memory cell can be reduced, thus decreasing the power consumption.

I claim:

1. A virtual ground type nonvolatile semiconductor memory device comprising:
    a plurality of row lines;
    a plurality of column lines;
    a plurality of floating-gate type nonvolatile memory cells, each connected between two adjacent ones of said column lines and connected to one of said row lines;
    a row selecting means, connected to said row lines, for selecting one of said row lines to apply a first definite voltage thereto during a read mode and apply a write power supply voltage thereto during a write mode;
    a read-mode column selecting means, connected to said column lines, for selecting two adjacent ones of said column lines to transmit data therefrom, and for applying a second definite voltage to two of said column lines each immediately on one side of said two adjacent column lines during a read mode; and
    a write-mode column selecting means, connected to said column lines, for selecting two adjacent ones of said column lines to apply the second definite voltage thereto, and for applying first and second write voltages to two of said column lines each immediately on one side of said two adjacent column lines during a write mode.

2. A device as set forth in claim 1, wherein said read-mode column selecting means applies the second definite voltage to all of said column lines except for said two adjacent column lines.

3. A device as set forth in claim 1, wherein said write-mode column selecting means applies the first write voltage to all of said column lines located on one side of said two adjacent column lines and applies the second write voltage to all of said column lines located on the other side of said two adjacent column lines.

4. A virtual ground type nonvolatile semiconductor memory device comprising:
- a plurality of row lines;
- a plurality of column lines;
- a plurality of floating-gate type nonvolatile memory cells, each connected between two adjacent ones of said column lines and connected to one of said row lines;
- a row selecting means, connected to said row lines, for selecting one of said row lines to apply a first definite voltage thereto during a read mode; and
- a read-mode column selecting means, connected to said column lines, for selecting two adjacent ones of said column lines to transmit data therefrom, and for applying a second definite voltage to two of said column lines each immediately on one side of said two adjacent column lines during a read mode.

5. A device as set forth in claim 4, wherein said read-mode column selecting means applies the second definite voltage to all of said column lines except for said two adjacent column lines.

6. A virtual ground type nonvolatile semiconductor memory device comprising:
- a plurality of row lines;
- a plurality of column lines;
- a plurality of floating-gate type nonvolatile memory cells, each connected between two adjacent ones of said column lines and connected to one of said row lines;
- a row selecting means, connected to said row lines, for selecting one of said row lines to apply a write power supply voltage thereto during a write mode; and
- a write-mode column selecting means, connected to said column lines, for selecting two adjacent ones of said column lines to apply the second definite voltage thereto, and for applying first and second write voltages to two of said column lines each immediately on one side of said two adjacent column lines during a write mode.

7. A device as set forth in claim 6, wherein said write-mode column selecting means applies the first write voltage to all of said column lines located on one side of said two adjacent column lines and applies the second write voltage to all of said column lines located on the other side of said two adjacent column lines.

8. A virtual ground type nonvolatile semiconductor memory device comprising:
- a plurality of row lines;
- a plurality of column lines;
- a plurality of floating-gate type nonvolatile memory cells, each connected between two adjacent ones of said column lines and connected to one of said row lines;
- first and second data read circuits;
- activating/deactivating circuits, connected to said first and second data circuits, for activating said first and second data read circuits during a read mode and for deactivating said first and second data read circuits to apply a first definite voltage to inputs thereof during a write mode,
- a row selecting means, connected to said row lines, for selecting one of said row lines to apply a second definite voltage thereto during a read mode and apply a write power supply voltage thereto during a write mode;
- first and second write control circuits for generating the first definite voltage during a read mode, and for generating first and second write voltages in accordance with write data during a write mode;
- first column selecting means, connected to said column lines and said data read circuits, for selecting two adjacent ones of said column lines to connect said two adjacent column lines to said first and second data read circuits, respectively; and
- second column selecting means, connected to said column lines and said first and second write control circuits, for connecting all of said column lines located on one side of said two adjacent column lines selected by said first selecting column lines to said first write control circuit and for connecting all of said column lines located on the other side of said two adjacent column lines selected by said first selecting column lines to said second write control circuit.

* * * * *